United States Patent
Rosales et al.

(10) Patent No.: US 9,543,731 B2
(45) Date of Patent: Jan. 10, 2017

(54) METHOD AND DEVICE FOR GENERATING SHORT OPTICAL PULSES

(71) Applicant: Technische Universitaet Berlin, Berlin (DE)

(72) Inventors: Ricardo Rosales, Berlin (DE); Dieter Bimberg, Berlin (DE)

(73) Assignee: Technische Universität Berlin, Berlin (DE)

( * ) Notice: Subject to any disclaimer, the term of this patent is extended or adjusted under 35 U.S.C. 154(b) by 0 days.

(21) Appl. No.: 14/660,231

(22) Filed: Mar. 17, 2015

(65) Prior Publication Data

US 2016/0276794 A1 Sep. 22, 2016

(51) Int. Cl.
| | | |
|---|---|---|
| H01S 3/00 | (2006.01) |
| H01S 5/062 | (2006.01) |
| H01S 5/065 | (2006.01) |
| H01S 3/067 | (2006.01) |

(52) U.S. Cl.
CPC ............ *H01S 3/0057* (2013.01); *H01S 3/067* (2013.01); *H01S 5/0657* (2013.01); *H01S 5/06216* (2013.01)

(58) Field of Classification Search
CPC ... H01S 3/0057; H01S 5/0657; H01S 5/06216
See application file for complete search history.

(56) References Cited

U.S. PATENT DOCUMENTS

| | | | | |
|---|---|---|---|---|
| 5,790,579 A | * | 8/1998 | Lee ..................... | B82Y 20/00 372/45.01 |
| 6,868,098 B1 | * | 3/2005 | Piche ................... | H01S 5/065 372/107 |
| 2003/0198273 A1 | * | 10/2003 | Ungar .................. | H01S 5/146 372/102 |
| 2006/0114949 A1 | * | 6/2006 | Ungar .................. | H01S 5/02 372/25 |
| 2007/0091942 A1 | * | 4/2007 | Leem ................... | H01S 5/065 372/18 |
| 2010/0142566 A1 | | 6/2010 | Liu et al. | |

OTHER PUBLICATIONS

A. Al-Muhanna, L. J. Mawst, and D. Botez, D. Z. Garbuzov, R. U. Martinelli, and J. C. Connolly, "High-power (>10 W) continuous-wave operation from 100-mm-aperture 0.97-mm-emitting Al-free diode lasers", Appl. Phys. Lett. vol. 73, No. 9, pp. 1182-1184 (1998).
A. P. Bogatov, T. I. Gushchik, A. E. Drakin, A. P. Nekrasov and V. V. Popovichev, "Optimization of waveguide parameters of laser in InGaAs/AlGaAs/GaAs heterostructures for obtaining the maximum beam width in the resonator and the maximum power output power", Quantum Electron. vol. 38, No. 10, pp. 935-939 (2008).

(Continued)

*Primary Examiner* — Eric Bolda
(74) *Attorney, Agent, or Firm* — Gordon & Rees LLP

(57) ABSTRACT

An embodiment of the invention relates to a method for generating short optical pulses comprising the steps of:
operating a single section semiconductor laser in a non-linear regime to emit chirped optical pulses at an output facet of the laser cavity, and
compressing the chirped optical pulses outside the laser cavity using a dispersive element in order to generate the short optical pulses.

14 Claims, 14 Drawing Sheets

(56) References Cited

OTHER PUBLICATIONS

K. Posilovic, T. Kettler, V. A. Shchukin, N. N. Ledenstov, U. W. Pohl, D. Bimberg, J. Pricke, A. Ginolas, G. Erbert, G. Tränkle, J. Jönsson, and M. Weyers, "Ultrahigh-brightness 850nm GaAs/AlGaAs photonic crystal laser diodes", Appl. Phys. Lett. vol. 93, No. 221102 (2008).

M. V. Maximov, Y. M. Shernyakov, I. I. Novikov, S. M. Kuznetsov, L. Y. Karachinsky, N. Y. Gordeev, V. P. Kalosha, V. A. Shchukin, and N. N. Ledentsov, "High performance 640 nm-range GaInP/AlGaInP lasers based on the longitudinal photonic bandgap crystal with narrow vertical beam divergence", IEEE J. Quantum Electron. vol. 41, No. 11, pp. 1341-1348 (2005).

N. A. Pikhtin, S. O. Slipchenko, Z. N. Sokolova, A. L. Stankevich, D. A. Vinokurov, I. S. Tarasov, ZH. I. Alferov, "16 W continuous-wave output power from 1003BCm-aperture laser with quantum well asymmetric heterostructure", Electron. Lett. vol. 40, No. 22, pp. 1413-1414 (2004).

N. N. Ledentsov, V. A. Shchukun, "Novel concepts for injection lasers", Opt. Eng. vol. 41, No. 12, pp. 3193-3203 (2002).

P. Crump, A. Pietrzak, F. Bugge, H. Wenzel, G. Erbert, and G. Tränkle, "975 nm high power diode lasers with high efficiency and narrow vertical far field enabled by low index quantum barriers", Appl. Phys. Lett. vol. 96, No. 131110 (2010).

P. M. Smowton, G. M. Lewis, M. Yin, H. D. Summers, G. Berry, and C. C. Button, "650-nm lasers with narrow far-field divergence with integrated optical mode expansion layers", IEEE J. Sel. Top. Quantum Electron. vol. 5, No. 3, pp. 735-739 (1999).

R. Scifres, W. Streifer, and R. D. Burnham, "Leaky wave room-temperature double heterostructure GaAs/GaAlAs diode laser", Appl. Phys. Letter. vol. 29, No. 1, pp. 23-25 (1976)

S. L. Chuang, Physics of Optoelectronics Devices, John Wiley, New York (1995), pp. 273-278.

V. Shchukin, N. Ledentsov, K. Posilovic, V. Kalosha, T. Kettler, D. Seidlitz, M. Winterfeldt, D. Bimberg, N. Y. Gordeev, L. Y. Karachinsky, I. I. Novikov, Y. M. Shernyakov, A.V. Chunareva, M. V. Maximsky, F. Bugge, and M. Weyers, "Tilted Wave Lasers: A Way to High Brightness Sources of Light", IEEE J. Quantum Electron. vol. 47, No. 7, pp. 1014-1027 (2011).

W. Schulz and R.Poprawe, "Manufacturing with novel high-power diode lasers", IEEE J. Sel. Top. Quantum Electron. vol. 6, No. 4, pp. 696-705 (2000).

W. Streifer, R. D. Burnham, and D. R. Scifres, "Substrate radiation losses in GaAs heterostructure lasers", IEEE J. Quantum Electron. vol. 12, No. 3, pp. 177-182 (1976).

K. Sato; "Optical Pulse Generation Using Fabry-Perot Lasers Under Continuous-Wave Operation", IEEE Journal of Selected Topics in Quantum Electronic, IEEE Service Center, Piscataway, NJ, vol. 9, No. 5, Sep. 1, 2003; pp. 1288-1293, XP011106622.

C. Calo, H. Schmeckebier, K. Merghem, R. Rosales, F. Lefarge, A. Martinez, D. Bemberg and A. Ramdane, "Frequency Resolved Optical Gating Characterization of Sub-ps Pulses from Single-Section InAs/InP Quantum Dash Based Mode-Locked Lasers", Optics Express, vol. 22, No. 2, Jan. 27, 2014, pp. 1742-1748, XP055292157.

R. Rosales, S.G. Murdoch, R.T. Watts, K.Merghem, A. Martinez, F. Lelarge, A. Accard, L.P. Barry and A. Ramdane, "High Perfonriance Mode Locking Characteristics of Single Section Quantum Dash Lasers", Optics Express, vol. 20, No. 8, Apr. 9, 2012, pp. 8649-8657, XP055292155.

R. Rosales, V.P. Kalosha, K. Posilovic, M.J. Miah, D. Bimberg. J. Pohi and M. Weyers, "High Brightness Photonic Band Crystal Semiconductor Lasers in the Passive Mode Locking Regime", Applied Physics Letters, AIP Publishing LLC, vol. 105, No. 16, Oct. 20, 2014 pp, 161101-1—161101-4.

European Search Report mailed Aug. 8, 2016 issued in European Patent Application No. 16156078.4—1556.

* cited by examiner

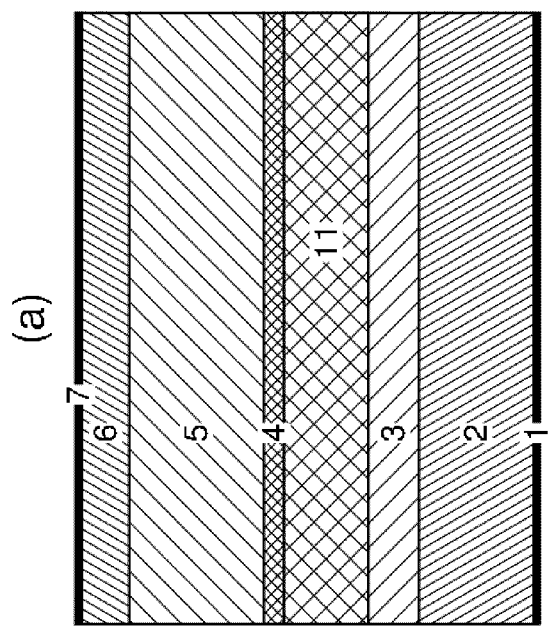
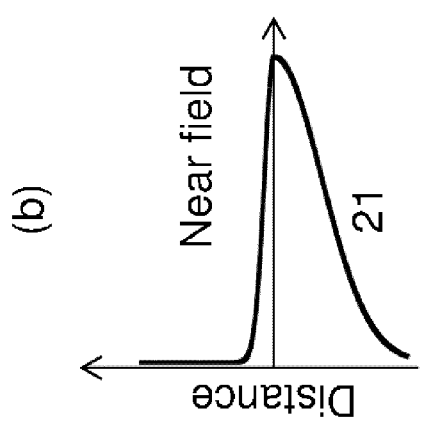
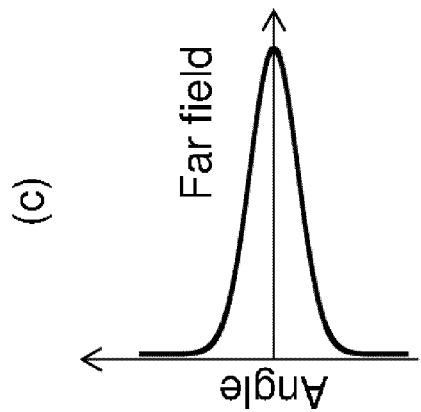
Fig. 4

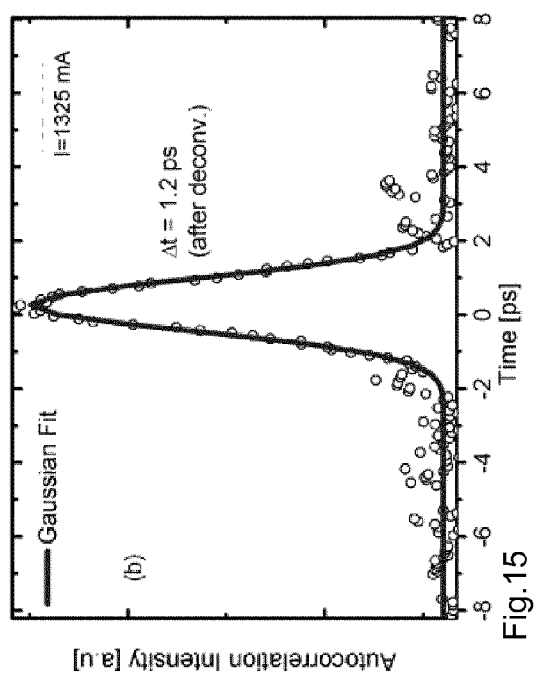
Fig. 15
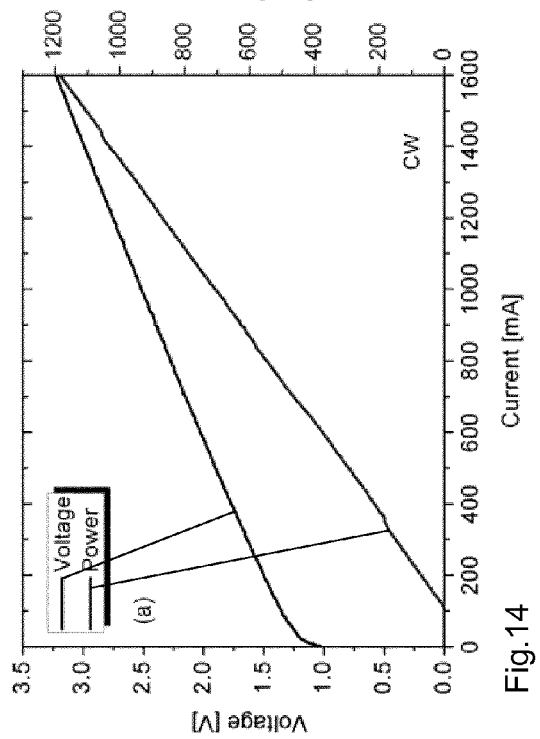
Fig. 14
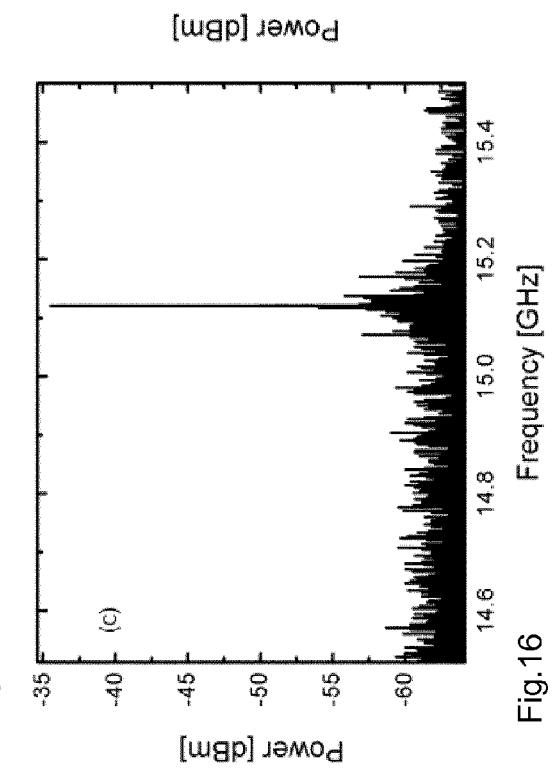
Fig. 17
Fig. 16

METHOD AND DEVICE FOR GENERATING SHORT OPTICAL PULSES

BACKGROUND OF THE INVENTION

High power laser systems emitting short optical pulses are useful for many emerging applications in materials processing, biotechnology, instrumentation, metrology and medicine, representing one of the fastest growing laser markets nowadays. In particular, semiconductor laser based systems can benefit from the higher efficiency, compactness, wavelength tunability, lower cost, as well as the reduced complexity and footprint of laser diodes when compared to commercially available Ti:sapphire and fiber lasers.

The generation of optical pulses in semiconductor laser diodes is commonly achieved by means of gain switching, by driving the laser diode with an electrical injection of high peak current pulses having a duration of a few hundred picoseconds. The minimum pulse width that can be achieved with this technique is typically of a few tens of picoseconds which is in many cases longer than required by most applications. Besides, the average power is typically limited to a few mW due to the low duty cycle of the electrical pulse train used to forward bias the laser diode.

Passive mode locking is another well-established technique from which less than 10 ps optical pulses are commonly attained. It makes use of a two-section laser configuration used for separately pumping a gain and an absorber section. The technique has the advantage of only requiring DC sources without any fast electronics, therefore being a compact and cost-effective alternative.

However, in order to obtain short picosecond pulses, the two-section laser needs to be driven with high reverse absorber bias in the absorber section and low injection currents in the gain section, also resulting in very low average powers in the order of a few mW. Another factor severely limiting the maximum achievable peak power of the laser is catastrophic optical damage as a consequence of the increase in optical power density when short optical pulses propagate within the cavity.

Furthermore, as high peak power pulses are absorbed by the saturable absorber section, a high photocurrent is generated causing catastrophic damage of the absorber element. Additionally, fabrication of the laser diode requires extra processing steps as well as more challenging post-processing techniques, particularly if the laser is to be p-side down bonded for efficient heat dissipation. This arises from the small gap that is required to electrically isolate the gain from the absorber section within the laser contact layers.

In both techniques, the low average power level is not sufficient for the aforementioned applications, which are currently being addressed by costly Ti:sapphire or fiber lasers providing average powers in the Watt level or more. One way of increasing the output power of semiconductor pulsed laser diodes is through optical amplification, resulting in the so-called master-oscillator power amplifier configuration, typically consisting of several pre-amplification and amplification stages based on solid state or semiconductor active media. Besides being a complex solution which is less compact and cost effective, another disadvantage of this configuration arises when amplifying ultra-short optical pulses in the ps or fs range due to the very high peak power levels generated within the amplifier, leading to detrimental nonlinear pulse distortion and damage of the gain medium. This problem can be overcome through complex and sophisticated chirped pulse amplification techniques, in which the short optical pulses are first stretched before being launched into the amplifier and then recompressed at its output.

OBJECTIVE OF THE PRESENT INVENTION

An objective of the present invention is to provide a method and a device for generating short optical pulses with high peak power and brightness.

BRIEF SUMMARY OF THE INVENTION

An embodiment of the invention relates to a method for generating short optical pulses comprising the steps of:
- operating a single section semiconductor laser in a nonlinear regime to emit chirped optical pulses at an output facet of the laser cavity, and
- compressing the chirped optical pulses outside the laser cavity using a dispersive element in order to generate the short optical pulses.

The single section semiconductor laser is preferably operated in a transverse fundamental single mode where the longitudinal mode phases are locked.

The single section semiconductor laser is preferably operated with a DC injection current.

The injected DC current is preferably such that the generated optical intensity within the laser causes nonlinear effects inside the gain medium of the laser's cavity.

The nonlinear effects preferably cause the longitudinal mode phases to be locked.

The nonlinear effects within the gain medium preferably cause mutual injection locking through the generation of side bands and lead to a correlation between the phases of the laser cavity modes.

Furthermore, the chirped optical pulses are preferably generated with an edge-emitting semiconductor laser having a multi-layered waveguide, said waveguide comprising at least one layer with an active region that emits light under electrical injection, and at least one aperiodic layer stack.

The invention also relates to a device for generating short optical pulses. A preferred embodiment of such a device comprises:
- a single section semiconductor laser capable of being operated in a nonlinear regime and generating chirped optical pulses at an output facet of the laser cavity,
- an electrical control unit connected to the single section semiconductor laser for operating the laser in the nonlinear regime, and
- a dispersive element being optically connected with the laser, the dispersive element being configured to compress the chirped optical pulses in order to generate the short optical pulses.

The control unit is preferably configured to operate the single section semiconductor laser in a transverse fundamental single mode where the longitudinal mode phases are locked.

The control unit is preferably configured to inject a DC injection current into the single section semiconductor laser.

The injected DC current is preferably such that the generated optical intensity within the laser causes nonlinear effects inside the gain medium of the laser's cavity.

The nonlinear effects preferably cause the longitudinal mode phases to be locked inside the laser cavity.

The nonlinear effects within the gain medium preferably cause mutual injection locking through the generation of side bands, leading to a correlation between the phases of the laser cavity modes.

According to a first preferred embodiment, the single section semiconductor laser is an edge-emitting semiconductor laser having a multi-layered waveguide, said waveguide comprising at least one layer with an active region that emits light under electrical injection, and at least one aperiodic layer stack.

The aperiodic layer stack preferably comprises an aperiodic leakage controlling sequence configured to cause leakage losses for higher order modes of the emitted light.

The aperiodic leakage controlling sequence preferably comprises layers of alternating refractive indices, said layers having either a first refractive index or a second refractive index, the first refractive index being larger than the second refractive index.

The thickness of the layers that have the first refractive index, preferably decreases inside said aperiodic leakage controlling sequence towards the active region, whereas the thickness of the layers that have the second refractive index, increases towards the active region.

The layer stack preferably comprises an aperiodic mode expansion sequence configured to expand the fundamental mode of the emitted light.

The aperiodic mode expansion sequence preferably comprises layers of alternating refractive indices, said layers having either a first refractive index or a second refractive index, the first refractive index being larger than the second refractive index.

The thickness of the layers of said mode expansion sequence preferably decreases towards the active region.

Furthermore, the layer stack may comprise both an aperiodic leakage controlling sequence configured to cause leakage losses for higher order modes of the emitted light, and an aperiodic mode expansion sequence configured to expand the fundamental mode of the emitted light.

In the latter embodiment, it is advantageous when said aperiodic leakage controlling sequence comprises layers of alternating refractive indices, said layers having either a first refractive index or a second refractive index, the first refractive index being larger than the second refractive index. The aperiodic mode expansion sequence preferably comprises layers of alternating refractive indices, said layers having either a third refractive index or a fourth refractive index, the third refractive index being larger than the fourth refractive index. The aperiodic mode expansion sequence is preferably located between the active region and the aperiodic leakage controlling sequence.

The fourth refractive index is preferably smaller than the second refractive index. The second refractive index is preferably smaller than the third refractive index. The third refractive index is preferably smaller than the first refractive index.

The thickness of the layers that have the first, third and fourth refractive index, preferably decreases towards the active region. The thickness of the layers that have the second refractive index, preferably increases towards the active region.

According to a second preferred embodiment, the device comprises an edge-emitting semiconductor laser,
- said laser having a multi-layered waveguide,
- said waveguide comprising at least one layer with the active region that emits light under electrical injection, at least one layer doped with p-type impurity at one side of the layer with the active region and multiple layers doped with n-type impurity, stacked between the substrate and the layer with the active region in the direction perpendicular to the light propagation forming an aperiodic sequence,
- wherein said waveguide has the fundamental mode localized at the layer containing the active region and expanded to the whole area of said multi-layered sequence,
- wherein said waveguide has all higher order modes localized at said multi-layered sequence with leakage losses into the substrate larger than that of the fundamental mode,
- wherein said waveguide provides a single-mode output radiation with small divergence.

The multi-layered sequence has preferably non-uniform doping by n-type impurity with increased concentration in the layers of localization of the higher order modes contiguous to the substrate with larger leakage and total internal losses of the higher order modes as compared to that of the fundamental mode.

The edge-emitting semiconductor laser preferably comprises heterostructures having III-IV or II-VI semiconductor materials.

The heterostructures preferably comprise one or multiple layers of quantum wells, quantum wires, or quantum dots as active region.

According to a third preferred embodiment, the device comprises an edge-emitting semiconductor laser,
- said laser having a multi-layered waveguide,
- said waveguide comprising at least one layer with the active region that emits light under electrical injection, at least one layer doped with n-type impurity at one side of the layer with the active region and multiple layers doped with p-type impurity, stacked between the contact layer and the layer with the active region in the direction perpendicular to the light propagation forming an aperiodic sequence,
- wherein said waveguide has the fundamental mode localized at the layer containing the active region and expanded to the whole area of said multi-layered sequence,
- wherein said waveguide has all higher order modes localized at said multi-layered sequence with leakage losses into the contact layer larger than that of the fundamental mode, wherein said waveguide provides a single-mode output radiation with small divergence.

The multi-layered sequence preferably has non-uniform doping by p-type impurity with increased concentration in the layers of localization of the higher order modes contiguous to the contact layer with larger leakage and total internal losses of the higher order modes as compared to that of the fundamental mode.

The edge-emitting semiconductor laser preferably comprises heterostructures having III-IV or II-VI semiconductor materials. The heterostructures preferably comprise one or multiple layers of quantum wells, quantum wires, or quantum dots as active region.

According to a fourth preferred embodiment, the device comprising an edge-emitting semiconductor laser,
- said laser having a multi-layered waveguide,
- said waveguide comprising at least one layer with the active region that emits light under electrical injection and multiple layers doped with n-type impurity and multiple layers doped with p-type impurity, stacked symmetrically or non-symmetrically below and above the layer with the active region till the substrate and till the contact layer, respectively, in the direction perpendicular to the light propagation forming aperiodic sequences, wherein said waveguide has the fundamental mode localized at the layer containing the active region and expanded to the whole areas of said multi-layered sequences, wherein said waveguide has all higher order modes localized at said multi-layered sequences with leakage losses into the contact layer and into the substrate larger than that of the fundamental mode, wherein said waveguide provides a single-mode output radiation with small divergence.

The sequences below and above the layer with the active region preferably have non-uniform doping by n-type impurity with increased concentration in the areas of the predominant localization of the higher order modes contiguous to the substrate and nonuniform doping by p-type impurity with increased concentration in the areas of the predominant localization of higher order modes contiguous to the contact layer, respectively, with larger leakage and total internal loss of the higher order modes than that of the fundamental mode.

The edge-emitting semiconductor laser preferably comprises heterostructures having III-IV or II-VI semiconductor material. The heterostructures preferably comprise one or multiple layers of quantum wells, quantum wires, or quantum dots as active region.

This lasers presented above provide high power and simultaneously small divergence of the output radiation in the vertical direction (direction of the epitaxial growth). The lasers are based on the realization that a laser waveguide consisting of a layer with an active region and multiple epitaxial layers, which are stacked on top of a high refractive index substrate in the direction perpendicular to the light propagation forming specific aperiodic sequences with a proper choice of the thicknesses and refractive indices of all the layers as functions of the vertical distance, providing expansion of the fundamental mode and attenuation of the higher order modes. The expanded fundamental mode is localized predominantly at the layer containing the active region and all higher order modes predominantly at the multiple layers. The multiple epitaxial layers are adjusted to provide also higher leakage losses into the substrate and/or contact layer of all higher order modes as compared to that of the fundamental mode. Localization of the modes and their leakage are controlled by the relations between the effective indices of the modes and the refractive indices of the active layer and the substrate (and/or contact layer), respectively. Because of selection by the confinement factor and the leakage losses in favor of the fundamental mode, the output radiation is single-mode and results in a single-lobe far field with small divergence in the vertical direction. Since the power density per facet area is decreased upon broadening the waveguide and expanding the fundamental mode, high power output is also made possible before the onset of thermal and current spreading, catastrophic optical mirror damage and other nonlinear optical effects. The lasers are applicable to essentially any semiconductor laser diode system based on (Al,Ga,In)(As,P,Sb,N) or other semiconductor heterostructures emitting in the infra-red, red, visible or UV wavelength ranges.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures and tables. Understanding that these figures and tables depict only typical embodiments of the invention and are therefore not to be considered to be limiting of its scope, the invention will be described and explained with additional specificity and detail by the use of the accompanying drawings in which FIGS. 2-6 in parts (b) illustratively present the modifications of the near field, in parts (c) illustratively present the divergence narrowing of the far field of the fundamental mode relative to the case of the edge-emitting laser of FIG. 1.

FIG. 2 shows a schematic diagram of a prior art laser [2]: (a) Cross-section view of an edge-emitting laser in the vertical and longitudinal directions as in FIG. 1 and with additional mode expanding layers (11), (12) below and above the active layer, respectively. Refractive index, thicknesses and positions of the mode expansion layers (11) and (12) are adjusted to obtain the mode expansion. (b) Near field profile of the expanded fundamental mode with additional expansion peaks (21) and (22) versus the vertical distance. (c) Far field profile of the fundamental mode with narrower divergence as compared to FIG. 1 versus the vertical angular coordinate.

FIG. 3 shows a schematic diagram of a prior art laser [3]: (a) Cross-section view of an edge-emitting laser in the vertical and longitudinal directions as in FIG. 1 with asymmetric positioning of the active layer (4) in the waveguide layers (11) and (12) between the substrate and contact layers (2) and (6). For appropriate asymmetric shift of the active layer, the confinement factor of the fundamental mode remains large, whereas the confinement factor of the second-order mode, next in the descending order of the confinement factor value, is substantially decreased. (b) Near field profile of the fundamental mode (solid curve) and second-order mode (dashed) versus the vertical distance. (c) Far field profile of the fundamental mode with divergence versus the vertical angular coordinate.

FIG. 4 shows a schematic diagram of a prior art laser [4]: (a) Cross-section view of a semiconductor edge-emitting laser in the vertical and longitudinal directions as in FIG. 1 with thick asymmetric mode expansion layer (11) below the active layer (4) and in the waveguide layer (3). The refractive index of the expansion layer (11) is adjusted to the effective index of the fundamental mode and provides its expansion towards this layer. (b) Near field profile of the fundamental mode with asymmetric expansion (21) towards the layer (11) versus the vertical distance. (c) Far field profile of the fundamental mode with narrow divergence versus the vertical angular coordinate.

FIG. 5 shows a schematic diagram of a prior art laser [7-8]: (a) Cross-section view of a semiconductor edge-emitting laser in the vertical and longitudinal directions based on the photonic band crystal concept with a photonic band crystal formed by a periodic sequence of pairs of low-index layers (11) and high refractive index layers (12) and with the active layer (4) as a defect of the photonic band crystal, where the fundamental mode peak is localized. The number of the layer pairs chosen for this drawing is for illustration purposes only and much smaller than actual number. (b) Near field profile of the fundamental mode localized at the defect expanding across the photonic band crystal in the part (21) versus the vertical distance. (c) Far field profile of the fundamental mode with narrow divergence versus the vertical angular coordinate.

FIG. 6 shows a schematic diagram of a prior art laser [9-11]: (a) Cross-section view of a semiconductor edge-emitting laser in the vertical and longitudinal directions with the layer (11) adjusted to match the effective index of the mode localized at the active layer (4) to the refractive index of the layer (11) and the refractive index of the substrate (2), providing mode leakage into the substrate (2). (b) Near field profile of the mode with large leaky component (41) existing in the thick substrate (2) versus the vertical distance. (c) Far field profile of the mode with a weak, broad component (51) due to the part of the field localized at the active layer and a strong, narrow leaky component (52) versus the vertical angular coordinate.

FIG. 14 shows the LIV curve of the optical device of FIG. 13.

FIG. 15 shows the autocorrelation trace of the optical device of FIG. 13.

FIG. 16 shows the radio frequency spectrum of the optical device of FIG. 13.

FIG. 17 shows the optical spectrum of the optical device of FIG. 13 at an injection current of 1.4 A.

DETAILED DESCRIPTION OF THE PREFERRED EMBODIMENT

The preferred embodiments of the present invention will be best understood by reference to the drawings, wherein identical or comparable parts are designated by the same reference signs throughout.

It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

Figure 13:
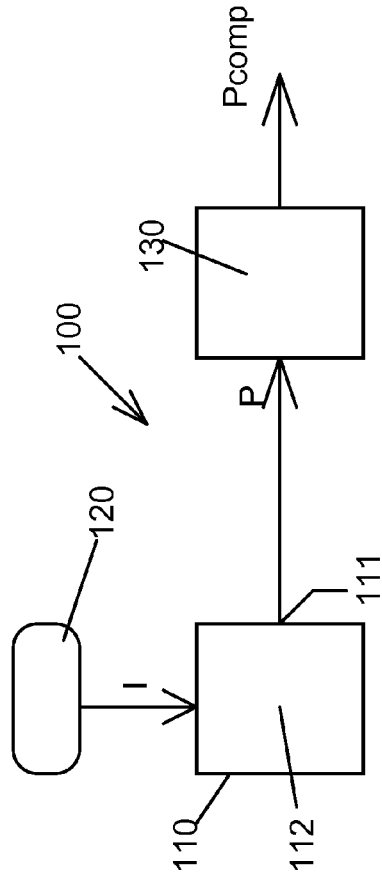
FIG. 13 shows a first exemplary embodiment of an optical device for generating short optical pulses according to the present invention.

FIG. 13 shows an optical device 100 for generating short optical pulses Pcomp. The device 100 comprises a single section semiconductor laser 110, an electrical control unit 120, and a dispersive element 130.

The electrical control unit 120 is connected to the single section semiconductor laser 110 and injects a DC current I which causes the laser to operate in a nonlinear regime. In this nonlinear regime, the laser is in a transverse fundamental single mode where the longitudinal mode phases are locked. As a result, the laser 110 generates chirped optical pulses P at an output facet 111 of the laser cavity 112.

The chirped optical pulses P pass the dispersive element 130 which compresses the chirped optical pulses and generates the short optical pulses Pcomp.

The laser 110 may have a cavity of 2.64 mm, and may be DC biased with an injection current of ~1.4 A producing 1.1 W of average power, as defined by its L-I-V curve shown in FIG. 14. The laser spectrum (see FIG. 17) at this current value consists of a number of longitudinal modes which are intrinsically phase locked. The laser output is also mostly linearly chirped and the amount of chirp is dependent on the injection current, among other factors. To compensate for the chirp, the laser emission is directed into the dispersive element 130 (e.g. about 30 km of single mode fiber) with a calculated amount of accumulated dispersion providing the necessary chirp compensation. At the fiber end, compressed and therefore short optical pulses Pcomp are generated. FIGS. 15 and 16 show the laser autocorrelation intensity and radio frequency spectrum, respectively.

The pulses Pcomp are 1.2 ps long at a repetition rate of ~15 GHz as defined by the laser cavity length of 2.64 mm (see radio frequency spectrum in FIG. 16). At 1.1 W of average power, this translates into 60 W of peak power and 2 $GWcm^{-2}sr^{-1}$ of peak brightness, provided the dispersive medium is lossless.

However, the dispersive element 130 used for the measurements shown in FIGS. 14-17 (i.e. 30 km of SMF fiber) introduced significant losses of about 10 dB. It is apparent that the performance of the optical device 100 can be optimized by using dispersive element 130 with lower losses (e.g. fiber Bragg gratings or prism pairs).

The repetition frequency of the short optical pulses Pcomp can be reduced down to the MHz range by choosing smaller cavity lengths.

Figure 18:
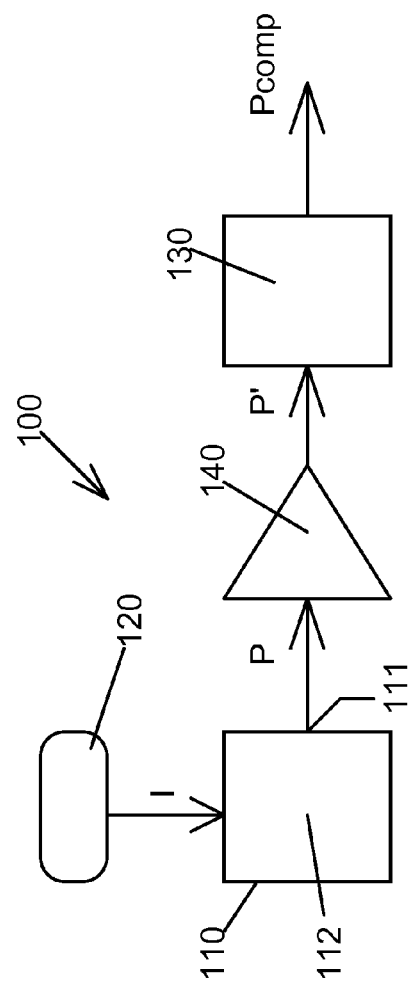
FIG. 18 shows a second exemplary embodiment of an optical device for generating short optical pulses according to the present invention.

FIG. 18 shows another exemplary embodiment of an optical device 100. The optical device 100 of FIG. 18 comprises an amplifier 140 to boost the power several orders of magnitudes (depending on amplifier type and configuration). The amplifier output P' is then dispersion compensated by the dispersive element 130. The dispersive element 130 may comprise or consist of a very low loss fiber Bragg grating or a prism pair.

The embodiments shown in FIGS. 13 and 18 overcome the low power limitation of prior art devices by using a high power high brightness laser diode 110 devoid of a saturable absorber. Embodiments for suitable lasers 110 will be described in detail further below. As no optical losses are introduced by an absorber element and owing to the specific laser structure design, the average power is at least two orders of magnitude larger than that of conventional 2-section semiconductor passively mode locked lasers. In the embodiments presented above, the laser gain is driven by a sufficiently high pump current in continuous wave operation. The high intracavity power induces nonlinear effects within the gain medium leading to phase mode synchronization within the longitudinal modes as well as a linearly chirped output which can be easily compensated. Specifically, these nonlinearities can provide mutual injection locking through the generation of side bands, leading to strong correlation between the phases of the laser cavity modes. Because of the large induced chirped within the laser cavity, the resulting pulses are largely stretched, leading to a basically constant optical intensity which does not result in premature laser damage or detrimental gain nonlinearities due to high peak power levels, as opposed to the case in standard two-section mode locked lasers where short optical pulses are generated within the cavity. The laser output can hence be further amplified without the need of sophisticated and expensive pulse stretching stages.

The high peak and average powers that can be obtained at the output of the dispersive element may already be compatible with industrial applications without the need of extra amplification or by using a smaller number of amplification stages as compared to systems using conventional 2-section passively mode locked laser seeds. In the case where further amplification is required, the devices presented above with reference to FIGS. 13 and 17 have the additional advantage of not being affected by the continuous wave background of amplified spontaneous emission typically degrading the pulse characteristics at repetition rates lower than the inverse of the upper-state lifetime of the gain medium.

The optical devices 100 presented above achieve average output powers in the Watt levels and single digit picosecond pulse widths or less while preserving single transverse mode operation with a high beam quality. This results in peak power and brightness in the order of tens of W and several $GW/cm^{-2}sr^{-1}$ without amplification after dispersion compensation. The fundamental repetition frequency can be defined by modifying the laser cavity length, which may also consist of an external cavity to provide for tunability as well as low repetition rates from a few GHz down to the MHz range.

Applications: In terms of specific applications for high power high brightness picosecond lasers in materials processing is the cutting of thin glass used for smartphone displays. Laser processing offers advantages over mechanical methods for thin-glass cutting because it eliminates some of the post-processing finishing steps required for the latter. Picosecond lasers are also highly suitable in structuring small, intricate parts made from carbon fiber reinforced polymer (CFRP). The picosecond laser has similarly been found useful for cutting thin metals. Typical materials for these industries are stainless steel, Hastelloy®, nitinol, and titanium. Among other specific applications are the cutting of polyimide foil, ablation of thin-film copper indium gallium selenide solar cells etc.

High power, high brightness picosecond pulsed lasers may be as well suitable in other application fields, such as in biotechnology and instrumentation, medicine and metrology. The following is a list of a few potential applications of high brightness pulsed laser sources:

Two photon microscopy
Time resolved fluorescence
Time-Resolved Fluorescence
CARS and SRS microscopy
Nonlinear molecular spectroscopy
THz time domain spectroscopy
Fluorescence Lifetime Imaging (FLIM)
Fluorescence Correlation Spectroscopy (FCS)
Fluorescence Lifetime Correlation Spectroscopy (FLCS)
Time-Resolved Photoluminescence (TRPL)
Single Molecule Spectroscopy
Time response characterization of opto-electronic devices
Dermatology Remote sensing Laser ranging With references to FIGS. 1 to 12, lasers will be presented hereinafter which are suitable for the optical devices 100 shown in FIGS. 13 and 18.

Figure 1:
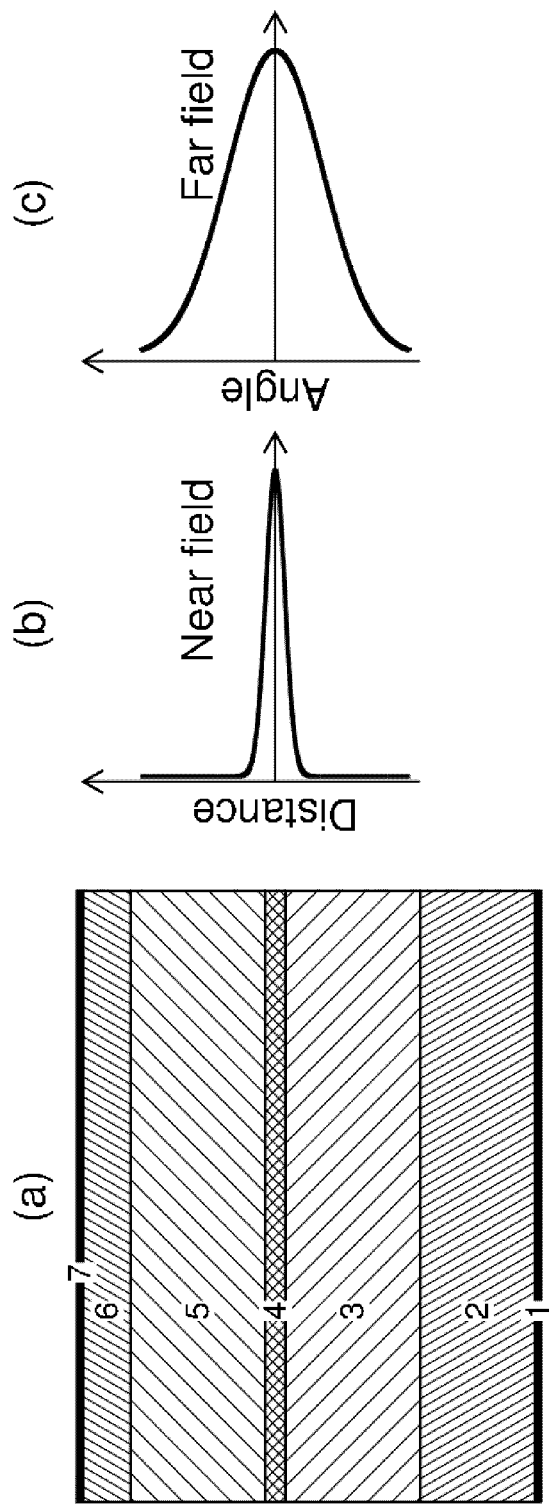
FIG. 1 shows a schematic diagram of a prior art laser: (a) Cross-section view of a standard semiconductor edge-emitting laser waveguide in the vertical and longitudinal directions (vertical and horizontal directions of the drawing, respectively) consisting of n- and p-type contacts designated (1) and (7), n-doped substrate (2), waveguide layers (3) and (5), waveguide layer (4) containing the active region and p-doped contact layer (6). (b) Near field profile of the fundamental mode versus the vertical distance showing narrow width due to a tight localization at the waveguide layer (4). (c) Far field profile of the fundamental mode showing large divergence as a function of the vertical angular coordinate. This figure as well as FIGS. 2-8 below in parts (a) is not to scale.
Figure 2:
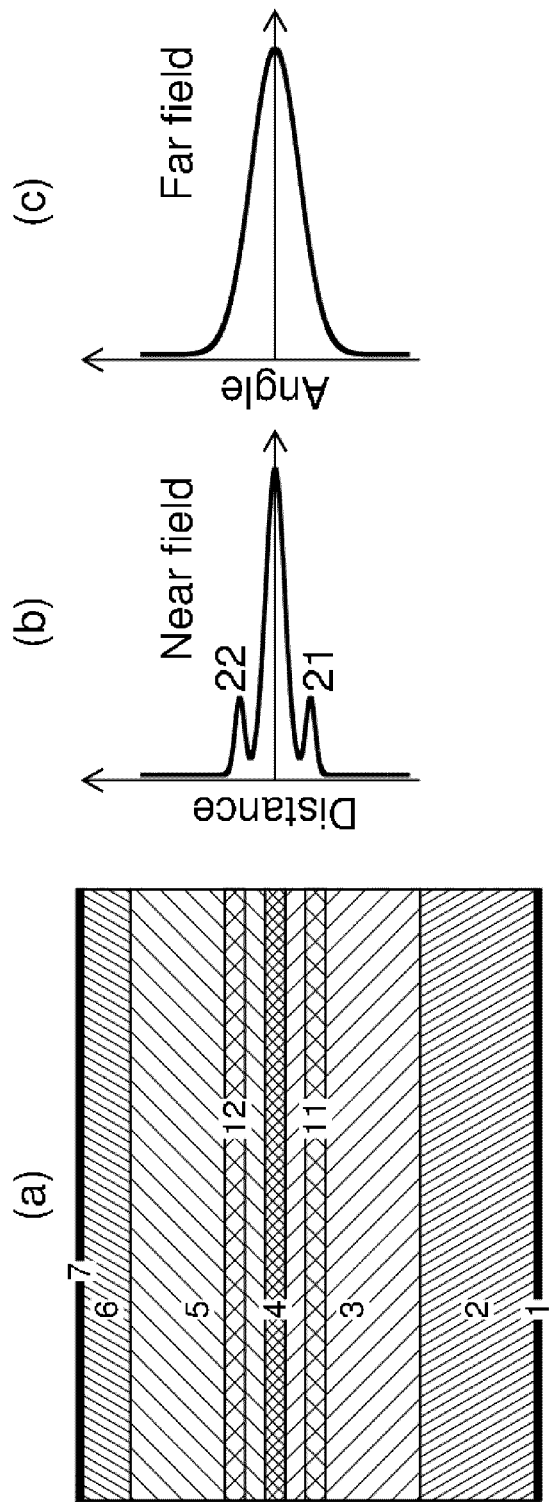
Figure 3:
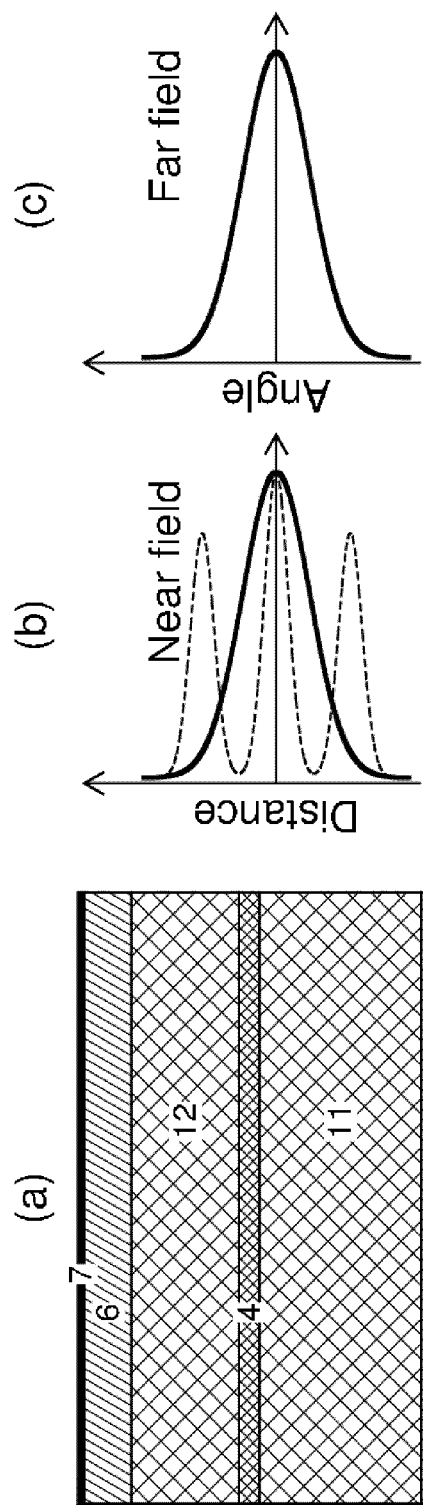
Figure 5:
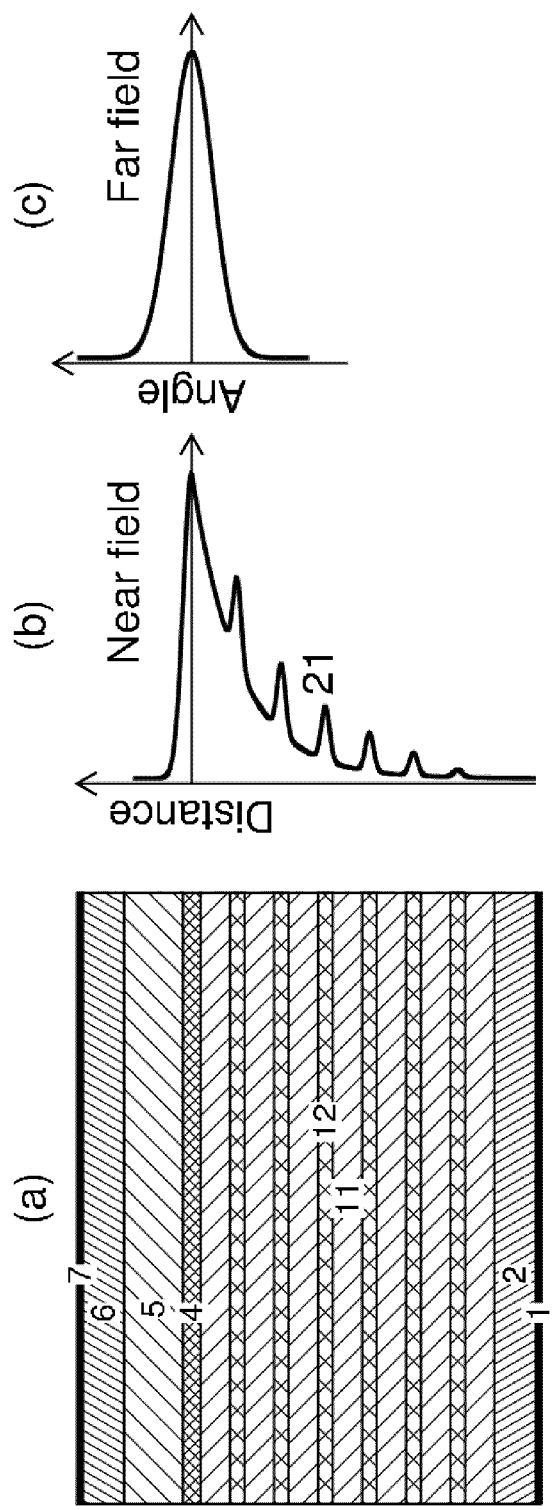
Figure 6:
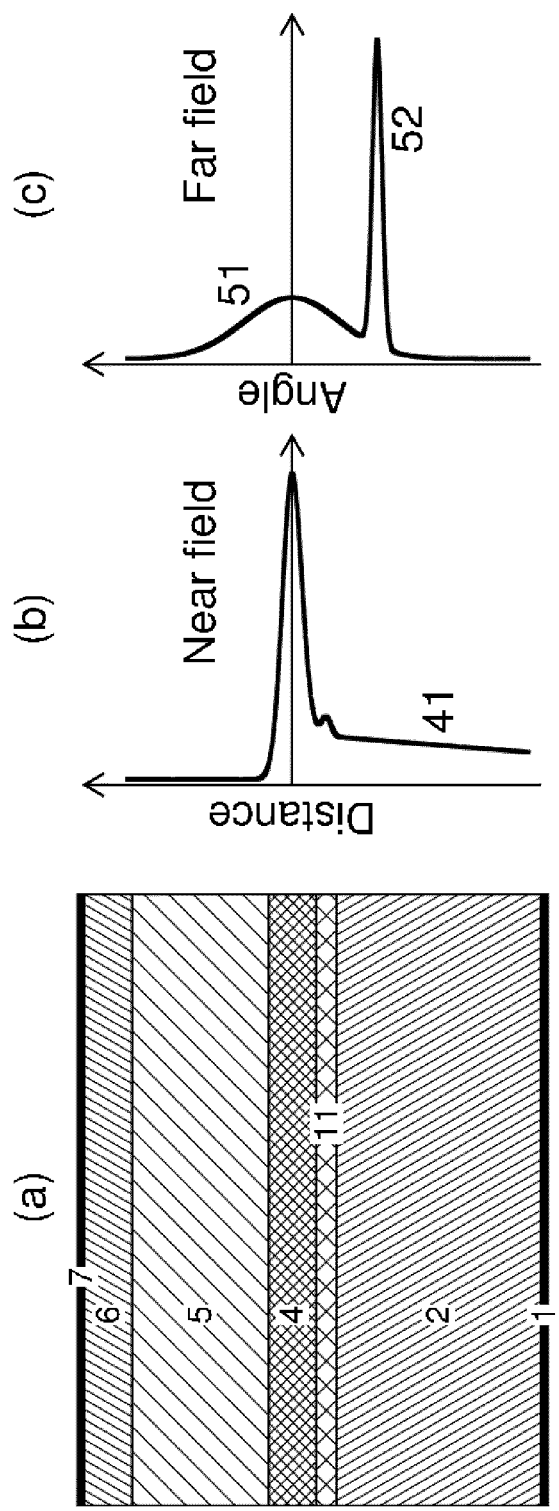

FIG. 1 is a cross-section view of a typical edge-emitting semiconductor laser in the vertical and longitudinal directions with n- and p-type contacts designated (1) and (7), n-doped substrate (2), n-doped waveguide layer (3) and p-doped waveguide layer (5), layer (4) with the active region (included, but not limited to, a single quantum well or multiple quantum wells, quantum wires, quantum dots, or any combinations thereof) and contact layer (6). Layers with these functionalities are present in all embodiments considered below. By current injection the quantum wells (wires, dots) in the active layer (4) provide the optical gain and the generated light propagates along the epitaxial layers. The refractive index of the layer with the active region (4) is larger than the refractive index of the top and bottom waveguide layers (3) and (5); refractive indices of the substrate (2) and contact layer (6) are larger than refractive indices of the waveguide layers (3) and (5). The diode is thus formed by a multi-layered heterostructure consisting of III-IV or II-VI semiconductor materials, like (AlGa)As/GaAs, (InGa)As/GaAs, (InGa) (AsP)/GaAs, (ZnMg)(SSe)/Zn(SSe), (Al,Ga,In)N.

Wave guiding in the lateral direction by multi-layered semiconductor waveguides as well as light amplification, laser output at the facets of the waveguides, active region current pumping, current flow through the layers doped by corresponding donors and acceptors, temperature effects and heat removal are performed in a well understood manner and their detailed description is not necessary for an understanding of the above (see, e.g. [13]). In particular, the spatial spectrum of the laser output in both vertical and lateral directions is presented as a combination of the vertical and lateral modes guided by the multi-layered heterostructures with contributions from each mode defined by the confinement factors and losses of the laser waveguide modes, and also by the optical gain exceeding the threshold gain.

For high brightness lasers both high power output and narrow divergence are required. For the vertical direction several methods to achieve narrow output beam were disclosed [2-12], which are illustrated in FIGS. 2-6.

Widening of the laser waveguide to increase the mode width and decrease the output beam divergence inevitably causes the worsening of the beam quality, since the waveguide becomes multi-mode. Suppression of higher order modes in favor of the fundamental mode with a single-lobe far field is needed. The high brightness may be achieved by utilizing wide-area heterostructures, consisting of specific aperiodic sequences of multiple epitaxial layers with alternating refractive indices (FIGS. 7-12). These sequences of the layers provide the expansion of the fundamental mode across the whole sequence, larger confinement factor and smaller leakage loss of the fundamental mode as compared to those of the higher order modes. By this way the output radiation becomes single-mode and has a single-lobe far field with narrow divergence in the vertical direction. That makes it possible to obtain a high brightness output due to the higher power of the broad-area laser waveguide feasible before the onset of thermal and current spreading, catastrophic optical mirror damage and other limiting nonlinear optical effects.

Discrimination between the vertical modes for the waveguide embodiments according to FIGS. 7-12 is proven based on the solution of the eigenvalue wave equation [13]. For the electric field $E(x,z,t)=E(x)\exp(i\beta z-i\omega t)$ of TE modes propagating along the multi-layered structures with the distribution of the refractive index $n(x)$, this equation reads as follows:

$$[d^2/dx^2+k^2n^2(x)]E(x)=\beta^2 E(x), \quad (1)$$

where $\beta$ is the propagation constant, $k=\omega/c$ is the wavenumber, $\omega$ is the frequency, x and z are the vertical and the longitudinal coordinates along the directions perpendicular and parallel to the layer planes, respectively, t is the time coordinate. Boundary conditions corresponding to non-reflecting conditions at the top and bottom of the considered computational domain are used and the solutions of Eq. (1) represent the multitude of the eigen-modes of the waveguides guided owing to the diffraction at the epitaxial layers.

The complex eigenvalue $\beta=\beta'+i\beta''$ defines the characteristics of the modes, such as the effective index $neff=\beta'/k$ and the losses $\alpha=2\beta''$. The latter are defined by the field leakage into the high refractive index substrate and contact layers, as well as by the presence of internal losses in the layers due to the material absorption in the layers and absorption by free carriers in the doped layers of the laser waveguide:

$$\alpha=\alpha_{leakage}+\alpha_{internal} \quad (2)$$

Furthermore, the electric field profiles $E(x)$ allows calculation of the confinement factors of the modes $\Gamma$, which are defined as the portion of the mode power overlapping with the active region of the laser waveguide.

Typically edge-emitting semiconductor lasers are considered as multi-layered waveguide structure of finite longitudinal length with the modes $E(x)\exp(\pm i\beta z)$ propagating forth and back between the facets of the structure. As it is followed from well-known laser threshold condition [13], each mode is considered to lase and contribute to the output of the laser when the optical gain g of the laser exceeds the threshold gain for this mode:

$$g>g_{threshold}=(\alpha_{leakage}+\alpha_{internal}+\alpha_{external})\Gamma, \quad (3)$$

where $\alpha_{external}$ are the mode external losses due to the laser radiation through the facets. When the reflectivities of the mode at the facets are R1 and R2, then $$\alpha_{external}=(1/2L)\ln(1/R1R2),$$

where L is the laser length. The facets are typically coated by special films, leading to high reflection and low reflection at the rear and output facets with $R1\approx 1$ and $R2<<1$, respectively, and thus the lasers emit predominantly through the output facet.

The laser embodiments are based on the realization that for high power single-mode lasing of the semiconductor lasers at high pump current levels the threshold gain of the fundamental mode should be much lower than the threshold gain of all higher order modes. This condition is fulfilled by increasing the leakage and internal losses and decreasing the confinement factors of the higher order modes. Both these control actions lead to an increase of the threshold of the higher order modes, as follows from Eq. (3). Then at high exceeding of the gain above the threshold, leading to the high output power, the spatial content of the laser radiation will consist of the fundamental mode only with a single lobe in the far field. When both actions are accompanied also by expansion of the fundamental mode in the near field with small divergence in the far field, the edge-emitting semiconductor lasers show high brightness output.

Specific aperiodic sequences of the layers located between high refractive index substrate and contact layers provide wide possibilities to control the localization, leakage and absorption of the modes.

First, varying the thickness and refractive index of the layer with the active region and at the same time thicknesses and alternating refractive indices of the layer sequence close to this layer one can obtain a fundamental mode localization with large confinement factor and broad extension of the field to the sequence. Physical effect responsible for mode expansion is the retraction of the field into high refractive index layers causing local maxima in the fields of the modes as functions of the vertical distance. A qualitative measure to achieve this objective is the proximity of the mode effective index to the mean refractive index of the sequence. The mode expansion sequence can be located below the layer with the active region. There can be also two mode expansion sequences above and below this layer.

Second, by specifically varying the thicknesses and alternating the refractive indices of the aperiodic layer sequences away from the active layer, localization of the higher order mode maxima away from the layer with the active layer, close to the substrate and/or to the contact layer can be achieved. This leads to a large leakage component into the substrate and/or contact layers. A qualitative measure to achieve this second objective is a shift of the 'center of gravity' of the refractive index profile towards the substrate and/or contact layer. The fundamental mode has a small field value in this leakage-controlling sequence and is not noticeably influenced by it. Hence, these two steps to achieve expanded fundamental mode with large confinement and small leakage and higher order modes with small confinement and large leakage do not conflict with each other and could be performed simultaneously.

Figure 7:
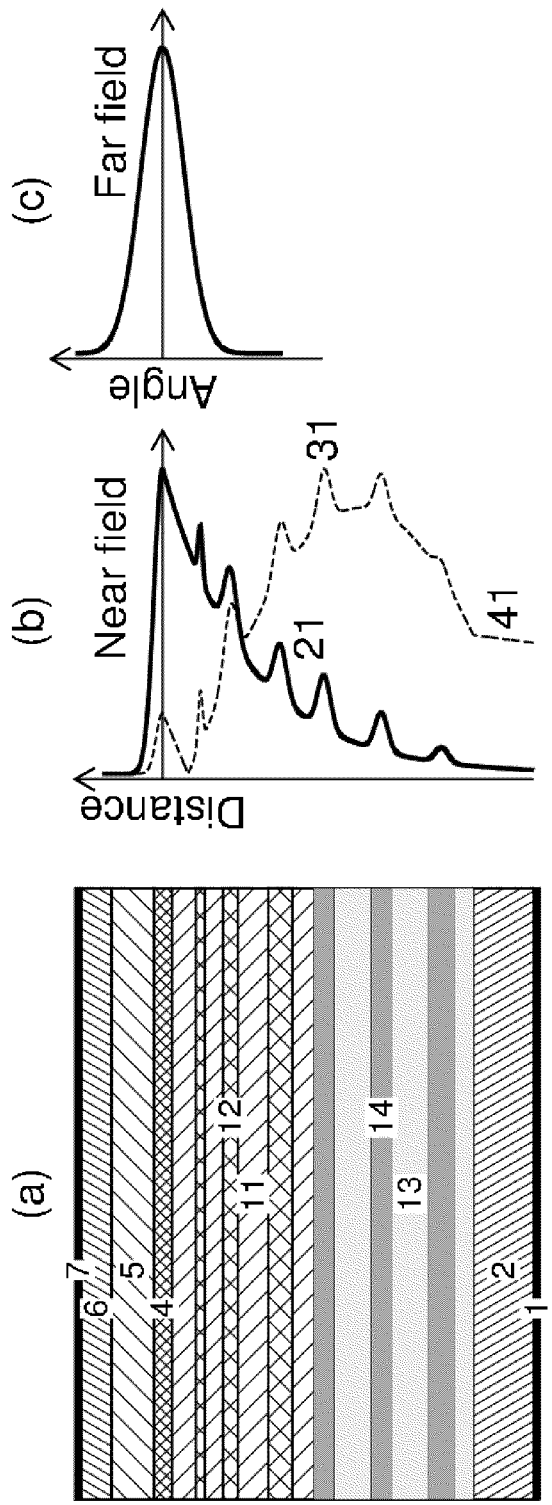
FIG. 7 shows a schematic diagram of a preferred embodiment of a laser for an optical device according to the present invention: (a) Cross-section view of a broad-area high brightness semiconductor laser where aperiodic sequence of the layers (11) and (12) with alternating refractive indices provides the expansion of the fundamental mode, localized predominantly at the layer with the active region (4), and aperiodic sequence of the layers (13) and (14) with alternating refractive indices provides, firstly, the localization of the higher order modes predominantly at the layer sequences (11) through (14) and, secondly, high loss due to the leakage into the substrate (2). (b) Near field profile of the fundamental mode (solid curve) and higher order mode (dashed) versus the vertical distance. The fundamental mode is localized predominantly at the layer with the active region (4) and expanded across the layer sequences in part (21). The higher order modes are localized predominantly at the layer sequence in part (31) and characterized by large loss due to large leakage component (41) in the substrate (2). (c) Far field profile of the fundamental mode with narrow divergence versus the vertical angular coordinate.

FIG. 7 is a graphical representation of a broad-area high brightness AlGaAs/GaInAs semiconductor laser at 1060 nm where aperiodic sequence of the layers (11) and (12) with alternating refractive indices provides the expansion of the fundamental mode localized predominantly at the layer with the active region (4), and aperiodic sequence of the layers (13) and (14) with alternating refractive indices provides, firstly, the localization of the higher order modes predominantly at the layer sequences (11) through (14) and, secondly, high loss due to the leakage into the substrate (2). In this embodiment of the laser on a GaAs substrate, the preferable material for the waveguide layers is $Al_xGa_{1-x}As$ with different Al content x. For the embodiment of FIG. 7 the content x alternates between 0.35 and 0.20 in the layers (11)-(12) and between 0.30 and 0.15 in the layers (13)-(14) and equals to 0.5 in the contact layer (5). The numbers of the layers (11)-(12) and (13)-(14) are equal to 7 and 6, thicknesses are 650, 150, 600, 200, 700, 370, 550 nm and 50, 780, 525, 840, 550, 390 nm (from top to bottom), respectively. The layer (4) of $Al_{0.2}Ga_{0.8}As$ contains the active region of, but not limited to, GaInAs quantum well with GaAsP quantum barriers of the total thickness 150 nm. Material content, thicknesses and number of the layers in the sequence are not limited to those chosen in the embodiment of FIG. 7. Mode-expansion sequence (11)-(12) and leakage-controlling sequence (13)-(14) are located in, but not limited to, between the active layer and the substrate. The fundamental mode has broadened near field profile (solid curve) in part (21) owing to the retraction of the mode field into high index layers (12) for the appropriate refractive index profile of the layers (11), (12) and for a given layer with the active region (4). The higher order modes, like first-order mode shown by the dashed curve, are characterized by the predominant localization at the layer sequence in part (31) and by large loss due to large leakage component (41) in the substrate (FIG. 7 (b)).

Far field profile of the fundamental mode calculated by the Fourier transformation with inclination term [13] is shown versus the vertical angular coordinate in FIG. 7 (c) and characterized by the narrow divergence of 10° (full width at half maximum) owing to the broad-area near field of the mode.

Figure 8:
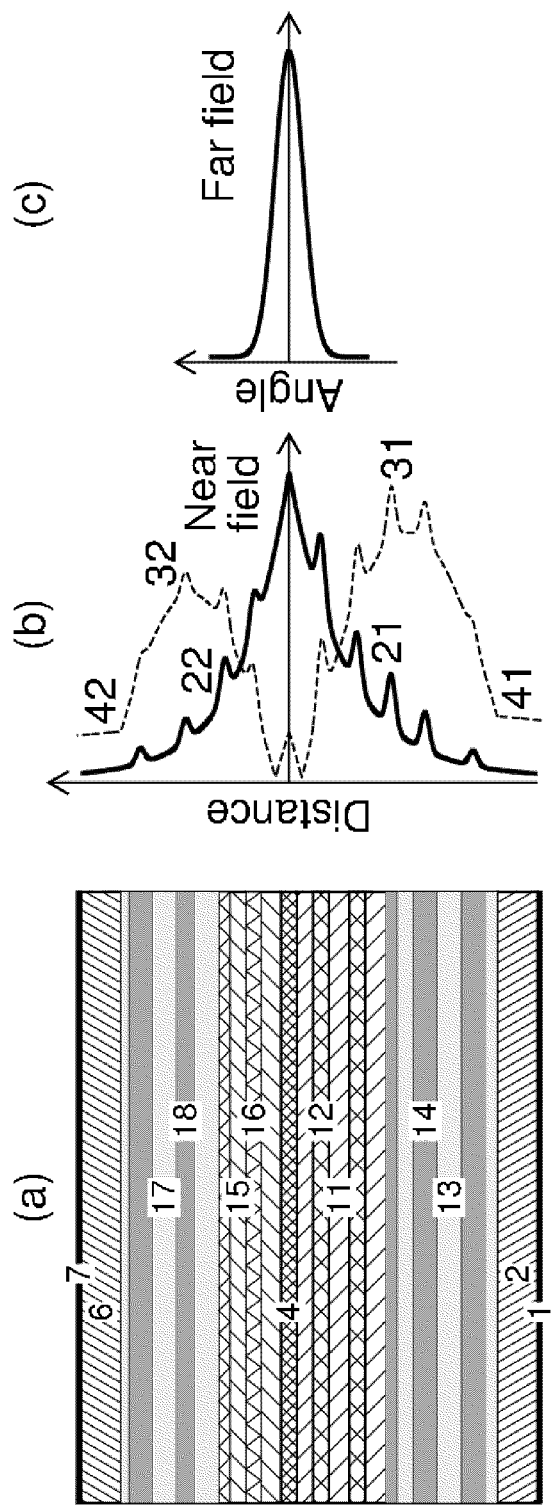
FIG. 8 (a) shows a schematic diagram of a preferred embodiment of a laser for an optical device according to the present invention: (a) Cross-section view of a broad-area high brightness semiconductor laser where aperiodic sequences of the layers (11), (12) and (15), (16) with alternating refractive indices at both sides of the layer with the active region (4) provide the expansion of the fundamental mode localized predominantly at the layer with the active region (4), and aperiodic sequences of the layers (13), (14) and (17), (18) with alternating refractive indices at the regions close to the substrate (2) and contact layer (6), respectively, provide, firstly, the localization of the higher order modes predominantly at the layer sequences (11) through (18) and, secondly, high loss due to leakage into the substrate (2) and the contact (6). In this drawing the numbers of the layers chosen and their thicknesses in all sequences are for illustration purpose only. (b) Near field profile of the fundamental mode (solid curve) and higher order mode (dashed) versus the vertical distance. The fundamental mode is located predominantly at the layer with the active region (4) and expanded across the layer sequences in parts (21) and (22). The higher order modes are localized predominantly at the layer sequences (11) through (18) in parts (31) and (32) and characterized by large losses due to large leakage components (41) and (42) into the substrate (2) and the contact layer (6), respectively. (c) Far field profile of the fundamental mode with narrow divergence versus the vertical angular coordinate.

FIG. 8 is a graphical representation of a broad-area high brightness AlGaAs/GaInAs semiconductor laser where aperiodic sequences of the epitaxial layers to expand the fundamental mode and discriminate the higher order modes are formed symmetrically or non-symmetrically at both sides in respect to the layer with the active region. In this embodiment aperiodic sequences of the layers (11), (12) and (13), (14) with alternating refractive indices at both sides of the layer with the active layer (4) provide the expansion of the fundamental mode localized predominantly at the layer with active region (4), and aperiodic sequences of the layers (15), (16) and (17), (18) with alternating refractive indices at the regions close to the substrate (2) and contact layer (6) provide, firstly, the localization of the higher order modes predominantly at the layer sequences (11) through (18) and, secondly, high loss due to the leakage into the substrate (2) and the contact (6). For the embodiment of FIG. 8 the content x alternates between 0.35 and 0.20 in the layers (11)-(12), (15)-(16) and between 0.30 and 0.15 in the layers (13)-(14), (17)-(18). The numbers of the layers (11)-(14) and (15)-(18) are equal to 11 and 9, thicknesses are 520, 420, 550, 400, 540, 300, 300, 650, 650, 750, 200 nm (from the active layer to substrate) and 400, 200, 350, 150, 300, 250, 350, 250, 100 nm (from active layer to contact layer), respectively. The layer (4) of $Al_{0.2}Ga_{0.8}As$ contains the active region of, but not limited to, GaInAs quantum well with GaAsP quantum barriers of the total thickness 100 nm. Material content, thicknesses and number of the layers in the sequence are not limited to those chosen in the embodiment of FIG. 7. Mode-expansion sequences (11), (12) and (13), (14) and leakage-controlling sequences (15), (16) and (17), (18) are located symmetrically or non-symmetrically between the active layer and the substrate and between the active layer and the contact layer. The fundamental mode is expanded over the layer sequences in parts (21) and (22). The higher order modes are localized predominantly at the layer sequences in parts (31) and (32) and characterized by large losses due to large leakage components (41) and (42) into the substrate (2) and the contact layer (6). The far field profile of the fundamental mode is characterized by the narrow divergence owing to the broad-area near field of the mode (FIG. 8 (c)).

Figure 9:
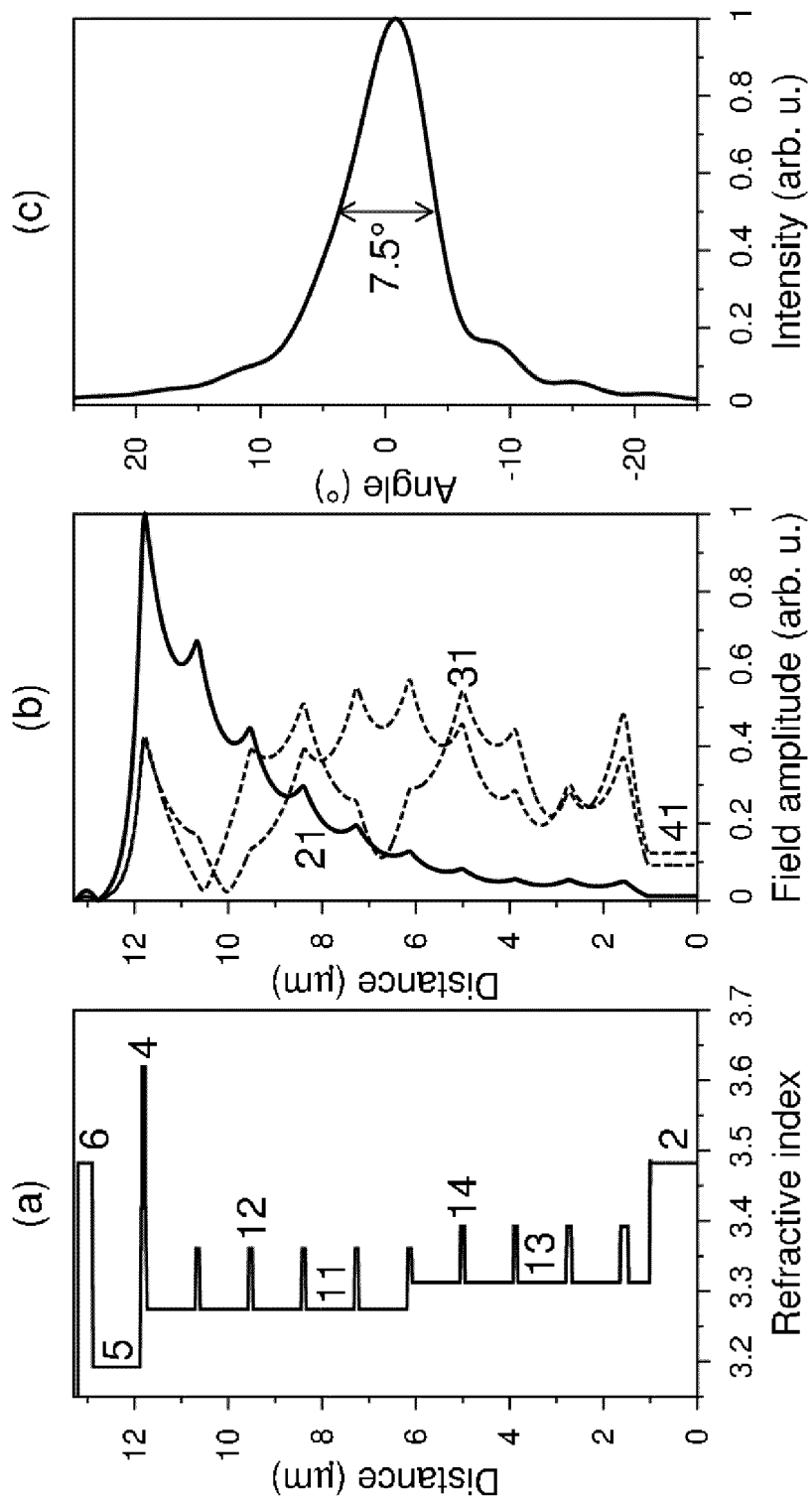
FIG. 9 shows various profiles for an embodiment of a laser waveguide: (a) refractive index profile for one possible embodiment of a 1060 nm AlGaAs/GaInAs laser waveguide with a substrate (2) of GaAs, a aperiodic leakage controlling sequence of five layer pairs (13) and (14) of Al0.3Ga0.7As and $Al_{0.15}Ga_{0.85}As$, thicknesses 400, 950, 1000, 1030, 1030 nm (from bottom to top) and 150, 90, 70, 50, 30 nm, a aperiodic mode-expansion sequence of five layer pairs (11) and (12) of $Al_{0.35}Ga_{0.65}As$ and $Al_{0.2}Ga_{0.8}As$, thicknesses 1030, 1030, 1020, 1020 nm and 30, 30, 20, 20 nm, a layer (4) of $Al_{0.2}Ga_{0.8}As$ with the active region of GaInAs/GaAsP, a waveguide layer (5) of $Al_{0.5}Ga_{0.5}As$, a contact layer (6) of GaAs. (b) Near field profile of the fundamental (solid curve) with an expansion (21) across the whole layer sequences and two higher order (dashed) modes with predominant localization at the layer sequences in parts (31) and large leakage components into the substrate (41). (c) Far field profile of the fundamental mode with full width at half maximum of 7.5°.

FIG. 9 (a) shows a preferred refractive index profile for a 1060 nm laser waveguide. The waveguide consists of, but not limited to, a substrate (2) of GaAs, a aperiodic leakage controlling sequence of five layer pairs (13) and (14) of $Al_{0.3}Ga_{0.7}As$ and $Al_{0.15}Ga_{0.85}As$, thicknesses 400, 950, 1000, 1030, 1030 nm (from bottom to top) and 150, 90, 70, 50, 30 nm, a aperiodic mode-expansion sequence of five layer pairs (11) and (12) of $Al_{0.35}Ga_{0.65}As$ and $Al_{0.2}Ga_{0.8}As$, thicknesses 1030, 1030, 1020, 1020 nm and 30, 30, 20, 20 nm, a layer (4) of $Al_{0.2}Ga_{0.8}As$ with the active region of GaInAs/GaAsP, a waveguide layer (5) of $Al_{0.5}Ga_{0.5}As$, and a contact layer (6) of GaAs. Near field profiles of the modes for this embodiment obtained by solution of Eq. (1) are shown in FIG. 9 (b). The fundamental mode (solid curve) is expanded across the whole layer sequences in part (21) and two higher order modes (dashed curves) with predominant localization at the layer sequences in parts (31) have large leakage components into the substrate (41). Due to mode expansion across the whole thick layer sequences (11)

through (14) the far field profile of the fundamental mode has extremely low full width at half maximum of 7.5° (FIG. 9 (c)).

Figure 10:
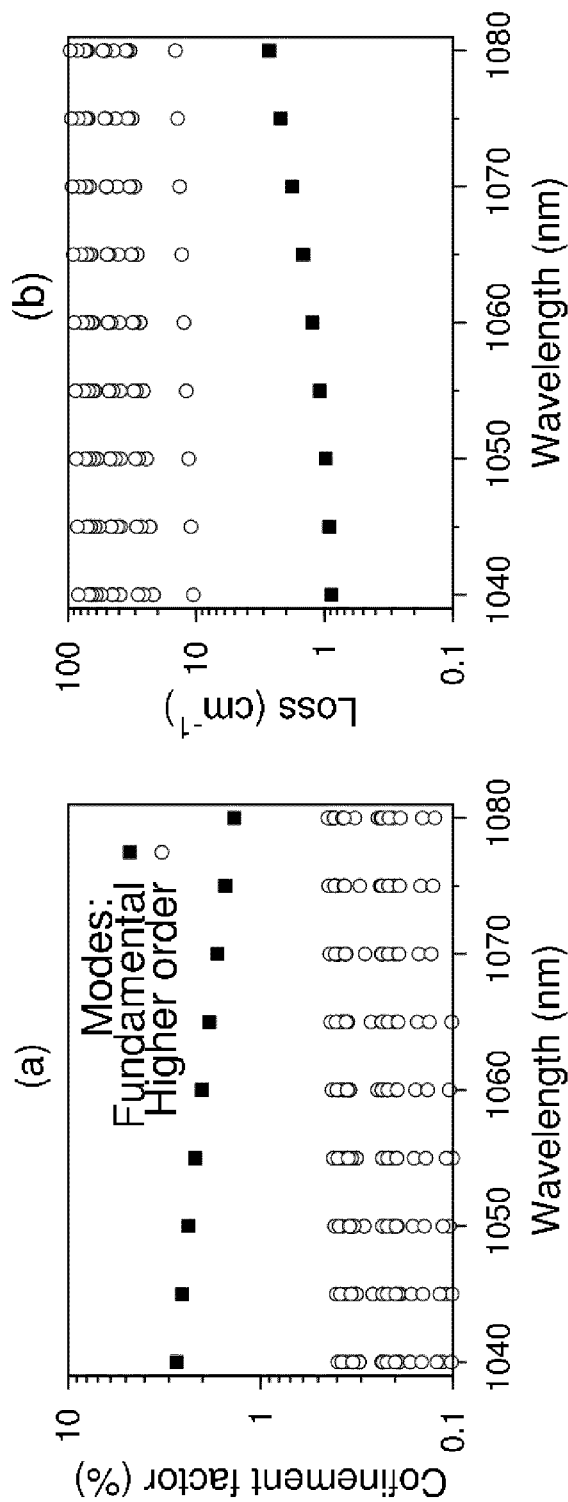
FIG. 10 shows confinement factors (a) and leakage losses (b) of the fundamental (solid squares) and higher order modes (empty circles) versus the wavelength for a laser waveguide for the possible embodiment as shown in FIG. 9.

FIG. 10 shows the leakage losses and the confinement factors of the fundamental (filled squares) and high order modes (empty circles) versus the wavelength for a high brightness broad-area edge-emitting laser at 1060 nm for the waveguide as shown in FIG. 9. The insensitivity in respect variations of the wavelength around 1060 nm in wide range is clearly visible. In the whole wavelength range the confinement factor is one order of magnitude larger and the leakage losses of the fundamental mode are one order of magnitude smaller than those of the multiple higher order modes of the waveguide. Thus, effective mode discrimination in favor of the fundamental mode occurs in a wide wavelength range.

Figure 11:
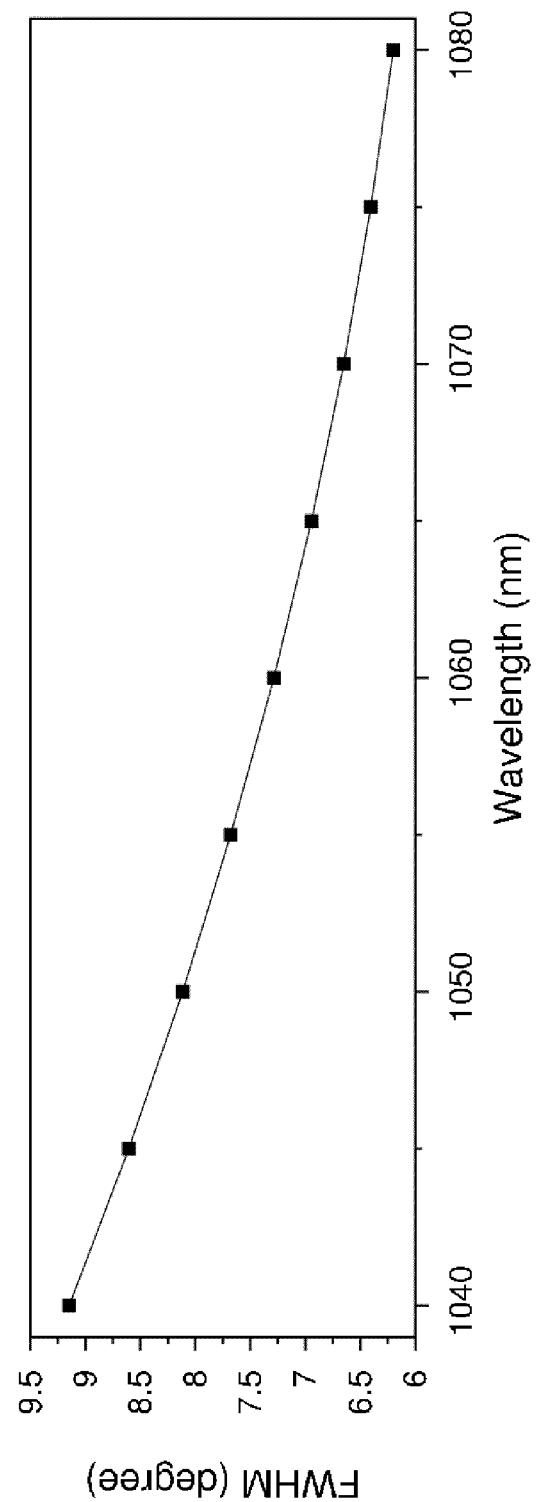
FIG. 11 shows full width at half maximum of the far-field intensity pattern of the fundamental mode versus the wavelength for the laser waveguide for the possible embodiment as in FIG. 9.

FIG. 11 shows the full width at half maximum of the far-field intensity pattern of the fundamental mode versus the wavelength for a possible embodiment of the waveguide as in FIG. 9. For a wide wavelength range the divergence is less than 9°.

Results of FIGS. 10 and 11 guarantee that this possible embodiment of the broad-area laser waveguide has a stable narrow divergence and high power, i.e. high brightness, of the output radiation for large exceeding of the pump current over the threshold and varying operational conditions, like temperature, capable to change the lasing wavelength in the semiconductor edge-emitting lasers.

Figure 12:
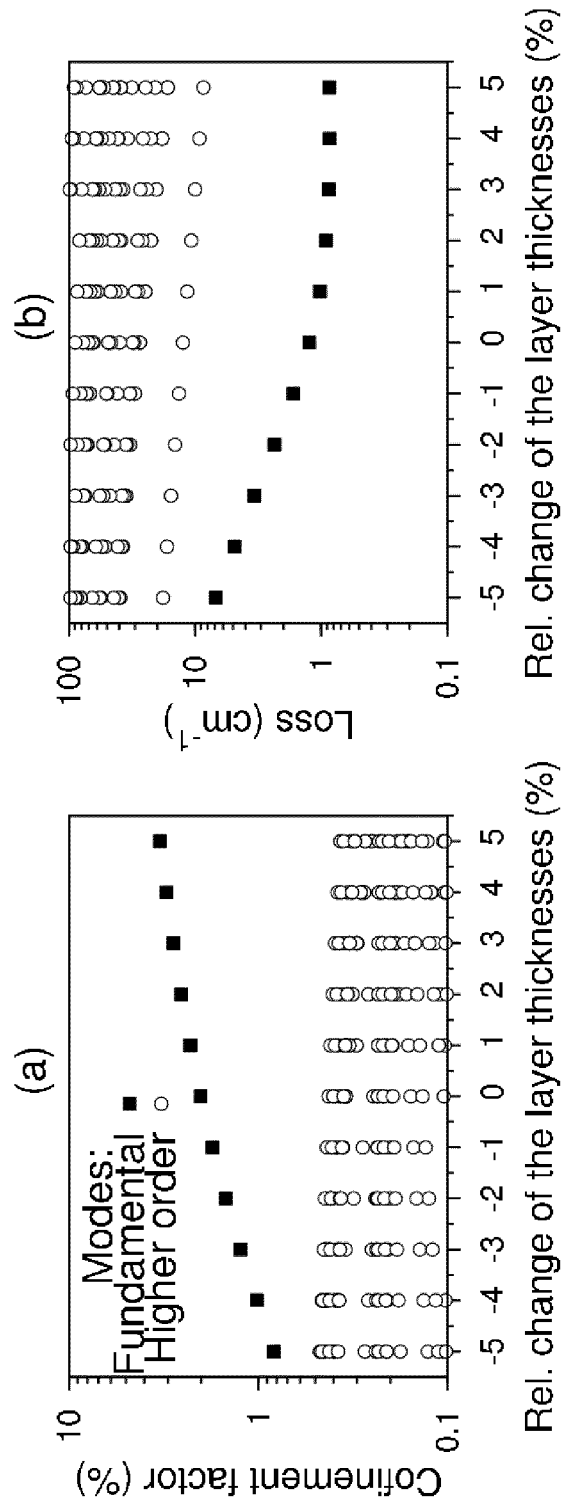
FIG. 12 shows confinement factors (a) and leakage losses (b) of the fundamental (solid squares) and higher order modes (empty circles) versus the relative change of the thicknesses of the layers in the aperiodic sequences of the layers (11) though (14) for the laser waveguide for the possible embodiment as in FIG. 9.

FIG. 12 shows the leakage losses and the confinement factors of the fundamental (filled squares) and higher order modes (empty circles) versus the relative change of the thickness of the layers for specific aperiodic sequences of the layers (11) though (14) for the possible embodiment of the waveguide as in FIGS. 9-11. For arbitrary changes of the layer thicknesses in both the mode-expansion and the leakage-controlling sequences within reasonable limits ±5%, the modes of the waveguide remain discriminated. This figure thus illustrates the insensitivity to tolerance variations of the layer thicknesses at the growth of the epitaxial layers. Similarly, insensitivity to the tolerance variations of the layer composition also occurs for a possible embodiment of the waveguide as in FIG. 8.

In another embodiment, the specific aperiodic sequences of the epitaxial layers to expand the fundamental mode and discriminate the higher order modes are formed below the layer with the active layer or symmetrically or non-symmetrically at both sides in respect to the layer with the active region and accompanied by non-uniform free carrier doping profiles in the sequences. These doping profiles provide additional increase of the internal losses of the higher order modes due to free-carrier absorption as compared to the internal losses of the fundamental mode according to Eq. (3). The maximum of the fundamental mode is located at the active layer, whereas the maxima of the higher order modes are located in the region close to the substrate and/or to the contact layer in the case when the modes are expanded towards both the directions with respect to the active layer. When the areas adjacent to the substrate and/or to the contact layer are doped heavier than the lightly doped or undoped region in and around the active layer, the difference in the total losses between the fundamental mode and the high order modes becomes more pronounced.

Since the power density per facet area is decreased upon broadening the waveguide and expanding the fundamental mode, larger output power is obtained before the onset of thermal and current spreading, catastrophic optical mirror damage and other nonlinear optical effects.

Laser diode systems based on (Al,Ga,In,P) (As,P,Sb), (Al,Ga,In)N and II-VI semiconductor heterostructures for the infra-red, red, visible and UV wavelength ranges are applicable.

In summary, optical devices 100 such as those shown in FIGS. 13 and 18 preferably comprise single section semiconductor lasers that have the following features:

First preferred embodiment of a laser for an optical device for generating short optical pulses:

According to a first preferred embodiment, the laser is an edge-emitting semiconductor laser,
  said laser having a multi-layered waveguide,
  said waveguide comprising at least one layer with the active region that emits light under electrical injection, at least one layer doped with p-type impurity at one side of the layer with the active region and multiple layers doped with n-type impurity, stacked between the substrate and the layer with the active region in the direction perpendicular to the light propagation forming an aperiodic sequence,
  wherein said waveguide has the fundamental mode localized at the layer containing the active region and expanded to the whole area of said multi-layered sequence,
  wherein said waveguide has all higher order modes localized at said multi-layered sequence with leakage losses into the substrate larger than that of the fundamental mode,
  wherein said waveguide provides a single-mode output radiation with small divergence.

Said multi-layered sequence preferably has non-uniform doping by n-type impurity with increased concentration in the layers of localization of the higher order modes contiguous to the substrate with larger leakage and total internal losses of the higher order modes as compared to that of the fundamental mode.

Said edge-emitting semiconductor laser preferably comprises heterostructures having III-IV or II-VI semiconductor materials. Said heterostructures preferably comprise one or multiple layers of quantum wells, quantum wires, or quantum dots as active region.

Second preferred embodiment of a laser for an optical device for generating short optical pulses:

According to a second preferred embodiment, the laser is an edge-emitting semiconductor laser,
  said laser having a multi-layered waveguide,
  said waveguide comprising at least one layer with the active region that emits light under electrical injection, at least one layer doped with n-type impurity at one side of the layer with the active region and multiple layers doped with p-type impurity, stacked between the contact layer and the layer with the active region in the direction perpendicular to the light propagation forming an aperiodic sequence,
  wherein said waveguide has the fundamental mode localized at the layer containing the active region and expanded to the whole area of said multi-layered sequence,
  wherein said waveguide has all higher order modes localized at said multi-layered sequence with leakage losses into the contact layer larger than that of the fundamental mode, wherein said waveguide provides a single-mode output radiation with small divergence.

Said multi-layered sequence preferably has non-uniform doping by p-type impurity with increased concentration in the layers of localization of the higher order modes contiguous to the contact layer with larger leakage and total internal losses of the higher order modes as compared to that of the fundamental mode.

Said edge-emitting semiconductor laser preferably comprises heterostructures having III-IV or II-VI semiconductor materials. Said heterostructures preferably comprise one or multiple layers of quantum wells, quantum wires, or quantum dots as active region.

Third preferred embodiment of a laser for an optical device for generating short optical pulses:

According to a third preferred embodiment, the laser is an edge-emitting semiconductor laser, said laser having a multi-layered waveguide,
said waveguide comprising at least one layer with the active region that emits light under electrical injection and multiple layers doped with n-type impurity and multiple layers doped with p-type impurity, stacked symmetrically or non-symmetrically below and above the layer with the active region till the substrate and till the contact layer, respectively, in the direction perpendicular to the light propagation forming aperiodic sequences,
wherein said waveguide has the fundamental mode localized at the layer containing the active region and expanded to the whole areas of said multi-layered sequences,
wherein said waveguide has all higher order modes localized at said multi-layered sequences with leakage losses into the contact layer and into the substrate larger than that of the fundamental mode,
wherein said waveguide provides a single-mode output radiation with small divergence.

Said sequences below and above the layer with the active region preferably have non-uniform doping by n-type impurity with increased concentration in the areas of the predominant localization of the higher order modes contiguous to the substrate and by p-type impurity with increased concentration in the areas of the predominant localization of higher order modes contiguous to the contact layer, respectively, with larger leakage and total internal loss of the higher order modes than that of the fundamental mode.

Said edge-emitting semiconductor laser preferably comprises heterostructures having III-IV or II-VI semiconductor material. Said heterostructures preferably comprise one or multiple layers of quantum wells, quantum wires, or quantum dots as active region.

Fourth preferred embodiment of a laser for an optical device for generating short optical pulses: According to a fourth preferred embodiment, the laser is an edge-emitting semiconductor laser, said laser having a multi-layered waveguide, and
said waveguide comprising at least one layer with an active region that emits light under electrical injection, and at least one aperiodic layer stack.

a) Aperiodic Layer Stack with Aperiodic Leakage Controlling Sequence:

Said layer stack preferably comprises an aperiodic leakage controlling sequence configured to cause leakage losses for higher order modes of the emitted light.

Said aperiodic leakage controlling sequence preferably comprises layers of alternating refractive indices, said layers having either a first refractive index or a second refractive index, the first refractive index being larger than the second refractive index.

The thickness of the layers that have the first refractive index, preferably decreases inside said aperiodic leakage controlling sequence towards the active region, whereas the thickness of the layers that have the second refractive index, preferably increases towards the active region.

b) Aperiodic Layer Stack with Aperiodic Mode Expansion Sequence:

Instead of an aperiodic leakage controlling sequence, said layer stack may comprise an aperiodic mode expansion sequence configured to expand the fundamental mode of the emitted light.

Said aperiodic mode expansion sequence preferably comprises layers of alternating refractive indices, said layers having either a first refractive index or a second refractive index, the first refractive index being larger than the second refractive index.

The thickness of the layers of said aperiodic mode expansion sequence preferably decreases towards the active region.

c) Aperiodic Layer Stack with Both, an Aperiodic Mode Expansion Sequence and an Aperiodic Leakage Controlling Sequence:

According to this embodiment, the layer stack comprises:
an aperiodic leakage controlling sequence configured to cause leakage losses for higher order modes of the emitted light, and
an aperiodic mode expansion sequence configured to expand the fundamental mode of the emitted light.

Said aperiodic leakage controlling sequence preferably comprises layers of alternating refractive indices, said layers having either a first refractive index or a second refractive index, the first refractive index being larger than the second refractive index.

Said aperiodic mode expansion sequence preferably comprises layers of alternating refractive indices, said layers having either a third refractive index or a fourth refractive index, the third refractive index being larger than the fourth refractive index.

The aperiodic mode expansion sequence is preferably located between the active region and the aperiodic leakage controlling sequence.

The fourth refractive index is preferably smaller than the second refractive index.

The second refractive index is preferably smaller than the third refractive index.

The third refractive index is preferably smaller than the first refractive index.

The thickness of the layers that have the first, third and fourth refractive index, preferably decreases towards the active region, whereas the thickness of the layers that have the second refractive index, preferably increases towards the active region.

REFERENCE SIGNS 1 n-type contact
2 substrate
3 waveguide layer
4 layer with the active region
5 waveguide layer
6 contact layer
7 p-type contact
11 mode expanding layers
12 mode expanding layers
13 leakage enhancing layers
14 leakage enhancing layers
15 mode expanding layers
16 mode expanding layers
17 leakage enhancing layers
18 leakage enhancing layers 21 expanded parts of the fundamental mode profile
22 expanded parts of the fundamental mode profile
31 expanded parts of the higher order mode profile
32 expanded parts of the higher order mode profile
41 leakage component of the mode profile
42 leakage component of the mode profile
51 broad weak part of the mode far field profile
52 narrow strong part of the mode far field profile
100 optical device
110 single section semiconductor laser
111 output facet
112 laser cavity
120 electrical control unit
130 dispersive element 130.
140 amplifier
I DC current
P chirped optical pulses
Pcomp compressed short optical pulses

REFERENCES CITED

1. W. Schulz and R. Poprawe, "Manufacturing with novel high-power diode lasers", IEEE J. Sel. Top. Quantum Electron. Vol. 6, No. 4, pp. 696-705 (2000).
2. P. M. Smowton, G. M. Lewis, M. Yin, H. D. Summers, G. Berry, and C. C. Button, "650-nm lasers with narrow far-field divergence with integrated optical mode expansion layers", IEEE J. Sel. Top. Quantum Electron. Vol. 5, No. 3, pp. 735-739 (1999).
3. N. A. Pikhtin, S. O. Slipchenko, Z. N. Sokolova, A. L. Stankevich, D. A. Vinokurov, I. S. Tarasov, Zh. I. Alferov, "16 W continuous-wave output power from 100 μm-aperture laser with quantum well asymmetric heterostructure", Electron. Lett. Vol. 40. no. 22, pp. 1413-1414 (2004).
4. A. P. Bogatov, T. I. Gushchik, A. E. Drakin, A. P. Nekrasov and V. V. Popovichev, "Optimization of waveguide parameters of laser InGaAs/AlGaAs/GaAs heterostructures for obtaining the maximum beam width in the resonator and the maximum output power", Quantum Electron. Vol. 38, No. 10, pp. 935-939 (2008).
5. A. Al-Muhanna, L. J. Mawst, and D. Botez, D. Z. Garbuzov, R. U. Martinelli, and J. C. Connolly, "High-power (>10 W) continuous-wave operation from 100-mm-aperture 0.97-mm-emitting Al-free diode lasers", Appl. Phys. Lett. Vol. 73, No. 9, pp. 1182-1184 (1998).
6. P. Crump, A. Pietrzak, F. Bugge, H. Wenzel, G. Erbert, and G. Tränkle, "975 nm high power diode lasers with high efficiency and narrow vertical far field enabled by low index quantum barriers", Appl. Phys. Lett. Vol. 96, No. 131110 (2010).
7. N. N. Ledentsov and V. A. Shchukin, "Novel concepts for injection lasers", Opt. Eng. Vol. 41, No. 12, pp. 3193-3203 (2002).
8. M. V. Maximov, Y. M. Shernyakov, I. I. Novikov, S. M. Kuznetsov, L. Y. Karachinsky, N. Y. Gordeev, V. P. Kalosha, V. A. Shchukin, and N. N. Ledentsov, "High performance 640 nm-range GaInP/AlGaInP lasers based on the longitudinal photonic bandgap crystal with narrow vertical beam divergence," IEEE J. Quantum Electron. Vol. 41, No. 11, pp. 1341-1348 (2005).
9. K. Posilovic, T. Kettler, V. A. Shchukin, N. N. Ledentsov, U. W. Pohl, D. Bimberg, J. Fricke, A. Ginolas, G. Erbert, G. Tränkle, J. Jönsson, and M. Weyers, "Ultrahigh-brightness 850 nm GaAs/AlGaAs photonic crystal laser diodes," Appl. Phys. Lett. Vol. 93, No. 221102 (2008).
10. W. Streifer, R. D. Burnham, and D. R. Scifres, "Substrate radiation losses in GaAs heterostructure lasers," IEEE J. Quantum Electron. Vol. 12, No. 3, pp. 177-182 (1976).
11. R. Scifres, W. Streifer, and R. D. Burnham, "Leaky wave room-temperature double heterostructure GaAs/GaAlAs diode laser," Appl. Phys. Lett. Vol. 29, No. 1, pp. 23-25 (1976).
12. V. Shchukin, N. Ledentsov, K. Posilovic, V. Kalosha, T. Kettler, D. Seidlitz, M. Winterfeldt, D. Bimberg, N. Y. Gordeev, L. Y. Karachinsky, I. I. Novikov, Y. M. Shernyakov, A. V. Chunareva, M. V. Maximov, F. Bugge, and M. Weyers, "Tilted Wave Lasers: A Way to High Brightness Sources of Light", IEEE J. Quantum Electron. Vol. 47, No. 7, pp. 1014-1027 (2011).
13. H. C. Casey and M. B. Panish, Semiconductor lasers. New York: Academic Press (1978).

The invention claimed is:

1. A method for generating short optical pulses comprising the steps of:
   operating a single section semiconductor laser in a nonlinear regime to emit chirped optical pulses at an output facet of the laser cavity; and
   compressing the chirped optical pulses outside the laser cavity by a dispersive element to generate the short optical pulses, wherein
   the single section semiconductor laser is operated with a DC injection current,
   the injected DC current is such that the generated optical intensity within the laser causes nonlinear effects inside a gain medium of the laser's cavity, and
   the chirped optical pulses are generated with an edge-emitting semiconductor laser having a multi-layered waveguide, the waveguide comprising at least one layer with an active region that emits light under electrical injection, and at least one aperiodic layer stack.

2. The method of claim 1 wherein the single section semiconductor laser is operated in a transverse fundamental single mode where longitudinal mode phases are locked.

3. The method of claim 1 wherein the nonlinear effects cause longitudinal mode phases to be locked.

4. The method of claim 3 wherein the nonlinear effects within the gain medium cause mutual injection locking through a generation of side bands and lead to a correlation between phases of the laser cavity modes.

5. An optical device for generating short optical pulses, the device comprising:
   a single section semiconductor laser capable of being operated in a nonlinear regime and generating chirped optical pulses at an output facet of a laser cavity;
   an electrical control unit connected to the single section semiconductor laser for operating the laser in the nonlinear regime; and
   a dispersive element being optically connected with the laser, the dispersive element being configured to compress the chirped optical pulses to generate the short optical pulses, wherein
   the control unit is configured to inject a DC injection current into the single section semiconductor laser,
   the injected DC current is such that the generated optical intensity within the laser causes nonlinear effects inside a gain medium of the laser's cavity, and
   the single section semiconductor laser is an edge-emitting semiconductor laser having a multi-layered waveguide, the waveguide comprising at least one layer with an active region that emits light under electrical injection, and at least one aperiodic layer stack.

6. The optical device of claim 5 wherein the control unit is configured to operate the single section semiconductor laser in a transverse fundamental single mode where longitudinal mode phases are locked.

7. The optical device of claim 5 wherein the device is configured so that the nonlinear effects cause longitudinal mode phases to be locked inside the laser cavity.

8. The optical device of claim 7 wherein the device is configured so that the nonlinear effects within the gain medium cause mutual injection locking through generation of side bands, leading to a correlation between phases of the laser cavity modes.

9. The optical device of claim 5 wherein said aperiodic layer stack comprises an aperiodic leakage controlling sequence configured to cause leakage losses for higher order modes of the emitted light.

10. The optical device of claim 9 wherein said aperiodic leakage controlling sequence comprises layers of alternating refractive indices, said layers having either a first refractive index or a second refractive index, the first refractive index being larger than the second refractive index.

11. The optical device of claim 10 wherein the thickness of the layers that have the first refractive index, decreases inside said aperiodic leakage controlling sequence towards the active region, whereas the thickness of the layers that have the second refractive index, increases towards the active region.

12. The optical device of claim 9 wherein said layer stack comprises an aperiodic mode expansion sequence configured to expand the fundamental mode of the emitted light.

13. The optical device of claim 12 wherein said aperiodic mode expansion sequence comprises layers of alternating refractive indices, said layers having either a first refractive index or a second refractive index, the first refractive index being larger than the second refractive index.

14. The optical device of claim 13 wherein the thickness of the layers of said mode expansion sequence decreases towards the active region.

* * * * *